United States Patent [19]

Etoh et al.

[11] 4,111,692

[45] Sep. 5, 1978

[54] ELECTROSTATIC PRINTING PLATE

[75] Inventors: Kuniomi Etoh; Shinichi Tanaka; Yoshio Kato; Watanabe Kazuo, all of Otsu, Japan

[73] Assignee: Toyo Boseki Kabushiki Kaisha, Osaka, Japan

[21] Appl. No.: 693,127

[22] Filed: Jun. 4, 1976

[51] Int. Cl.² .......................... G03G 5/04; G03F 7/02

[52] U.S. Cl. .......................................... 96/1 R; 96/33; 96/67; 96/88; 101/426; 427/12; 427/13; 427/26; 96/15 R

[58] Field of Search .................... 96/1 R, 33, 36.3, 35, 96/11.5, 88, 67; 101/426; 427/12, 13, 26

[56] References Cited

U.S. PATENT DOCUMENTS

| | | | |
|---|---|---|---|
| 3,525,612 | 8/1970 | Holstead et al. ....................... | 96/1 R |
| 3,697,274 | 10/1972 | Herrmann ............................. | 96/36.3 |
| 3,728,120 | 4/1973 | Hazenbosch et al. ............... | 96/35 X |
| 3,944,417 | 3/1976 | Lind ...................................... | 96/1 R |

*Primary Examiner*—Edward C. Kimlin

*Attorney, Agent, or Firm*—Birch, Stewart, Kolasch and Birch

[57] ABSTRACT

An electrostatic printing plate is obtained by forming a permanent electroconductive pattern on its exposed portion, which is effected by irradiation of light to expose a light image on a photosensitive material comprising a photosensitive composition containing an aliphatic nitrogen compound and an organic halogen compound capable of generating a free radical upon irradiation by light.

36 Claims, 1 Drawing Figure

ELECTROSTATIC PRINTING PLATE

FIELD OF THE INVENTION

This invention relates to an electrostatic printing plate which employs a photosensitive composition containing an aliphatic nitrogen compound and an organic halogen compound capable of generating a free radical upon irradiation by light.

BACKGROUND OF THE INVENTION

At the present day a vast amount of information is dealt with in every phase of a civilized community. Among means which make the information communication smoother the print and the copy play an important part. Particularly, printing of relatively small numbers of copies falling in a category intermediate between the press-printing and hand-copying, that is, copies in the category of duplication printing tend to increase in quantity. To comply with such demand a copy duplicating machine for exclusive use in this category is eagerly desired. Among various printing systems of diverse principles an electrostatic printing system is believed to be most favorable because the printing operation requires no compression, is easy and dry, and is feasible at a higher speed. A wide variety of electrostatic printing systems have been proposed but a system without a substantial problem is not available. This invention utilizes the irradiation of light for the manufacture of a printing plate.

Photoresist methods are well known in the art; however, there exist many disadvantages. Long periods of exposure are necessary and complicated treatment to develop a photoresist image after the exposure are required for the manufacture of the printing plate. In order to prepare a printing plate more promptly recent researchers have been directed to the utilization of photoconductors which are presently used in the field of electrostatic photography. The photoconductor is of course considered to be highly excellent with respect to inter alia photosensitivity. However, the electroconductivity offered by the photoconductor is transient, ie., is effective only during its exposure to light and disappears immediately after the removal of light. Consequently, an electrostatic charge pattern obtained by charging the photoconductor and exposing it to a light image may not last for long periods. Such a short life of the charge pattern is not suitable for the printing of several or numbers of copies.

SUMMARY OF THE INVENTION

An object of this invention is to provide an improved electrostatic printing plate which employs a novel photosensitive composition, in which a single exposure to light can establish permanent electroconductivity. Charging after the exposure to a light image may result in an electrostatic charge pattern eliminating the requirement for reexposure to the light. The photosensitive composition employed herein mainly consists of an aliphatic nitrogen compound and an organic halogen compound capable of generating a free radical upon the irradiation of light.

The inventors have taken measurements of the volume electric resistivity of the photosensitive composition before and after the exposure to light and found that the exposed portion is increased in electroconductivity to a large extent. It has also been found that the change in electroconductivity may remain the same even after one month under the constant conditions of relative humidity and temperature and is therefore irreversible. The inventors have made another determination. After a photosensitive material made of the photosensitive composition of the present invention is exposed to the light transmitted through an original, it is submitted to a corona discharge. The determination of a difference in charge potential between the exposed and unexposed portions shows that the exposed portion is extremely less charged than the unexposed portion by a difference of several hundred volts. This difference is large enough for the electrostatic reproduction of copies. The inventors have ascertained after the above-mentioned investigation and development that an electrostatic charge pattern can be obtained in a specified photosensitive material and utilized in the invention described hereinafter.

DESCRIPTION OF THE DRAWING

The present invention will become more fully understood from the detailed description given hereinbelow and the accompanying drawings which are given by way of illustration only, and thus are not limitative of the present invention, and wherein:

In the drawing, the single FIGURE is a diagrammatic illustration of an electrostatic printing machine in which a printing plate according to this invention is employed.

Figure 1:
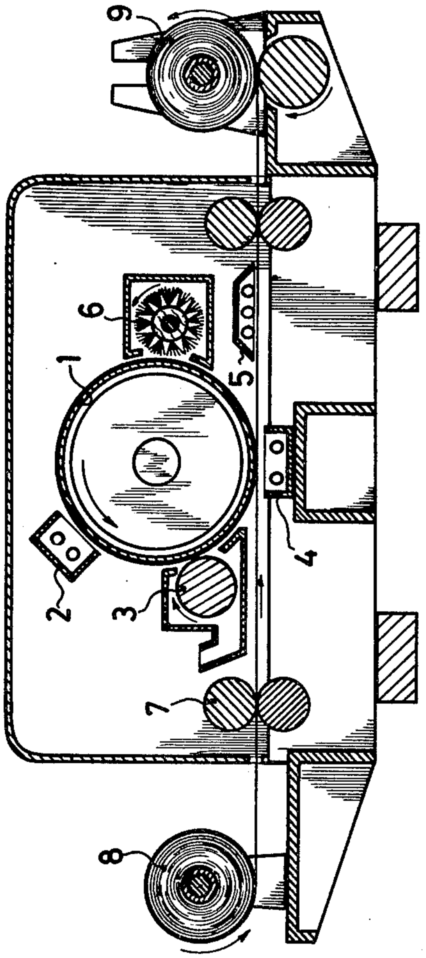

The printing machine comprises a drum 1 on which a printing plate is wound, a corona discharge head 2 for charging the plate on the drum 1, a magnet means 3 for supplying toner to develope a pattern on the plate, a corona discharge head 4 for transferring the toner on the plate to a paper sheet, and a heater 5 for fixing the transferred toner on the sheet. The paper to be printed from a roll 8 is supplied through carrying rollers 7 to a transfer region and then wound up by another roll 9. 6 is a rolling brush for removing the residual toner.

DETAILED DESCRIPTION OF THE INVENTION

According to this invention there is provided an electrostatic printing plate wherein a permanent electroconductive pattern is formed on its exposed portion. This is effected by exposing the plate to a light image the plate comprising mainly of a photosensitive composition containing an aliphatic nitrogen compound and an organic halogen compound capable of generating a free radical upon irradiation by light. The photosensitive composition containing the above two components is formed into a suitable material in the form of sheet, film coating and the like. The material is then exposed to a light image to form a permanent electroconductive pattern corresponding to the given image. The material with the permanent electroconductive pattern is ready for use as a master printing plate in electrostatic transfer printing.

The printing plate according to this invention can reproduce several or numbers of copies, because a light image of a document is projected and fixed on a material as a pattern different in electroconductivity, wherein the pattern can remain, permanently, even after the removal of light. The material with the electroconductive pattern is then submitted to a corona discharge or the like to form an electrostatic charge pattern corresponding to the electroconductive pattern. The charge pattern is developed with toner and the toner image is in turn transferred to a sheet of paper to obtain a desired copy. Since the change in electroconductivity of the master printing plate according to this invention is permanent or not affected in the course of the above treatment, the procedure of corona discharge-toner development-transfer can be repeated to reproduce any desired number of copies from the same electrostatic printing plate.

In principle this invention utilizes a difference in electroconductivity between the exposed and unexposed portions of the photosensitive material for the electrostatic printing. In a preferred embodiment of this invention the unexposed portion has a volume electric resistivity of more than $10^{12}\Omega$ cm and the quotient of volume resistivity of the unexposed portion by that of the exposed portion is not less than 2. More preferably, the unexposed portion has a volume electric resistivity of more than $10^{13}\Omega$ cm and the quotient of volume electric resistivity of the unexposed portion by that of the exposed portion is not less than 10. If the ratio of volume electric resistivities of the unexposed to the exposed portion is less than 2, areas other than the unexposed portion are also influenced more or less so that a clear pattern and therefore a distinct printed image is not available. Further, if the volume electric resistivity of the starting photosensitive composition is less than $10^{12}\Omega$ cm, a smaller amount of toner adhered to the printing plate may result in a printed image with less density.

The volume electric resistivity given above is the measured value obtained after the sample is left in a dessicator chamber containing $P_2O_5$ for 120 hours.

In the aliphatic nitrogen compound according to the present invention, the carbon atoms adjacent to the nitrogen atom are all aliphatic, and more specifically none of the groups connecting to the nitrogen atom has a conjugated structure by $\pi$-bonding with lone paired electrons of the nitrogen atom.

The photosensitive composition employed herein contains an aliphatic nitrogen compound. In general, the aliphatic nitrogen compound is basic and may form salts with various acids. More particularly, the aliphatic nitrogen compound the acid dissociation constant of which is within the range from 7.50 to 11.40, is favorable. If the acid dissociation constant is less than 7.50, the electroconductivity established in a photosensitive composition after the exposure is insufficient. Such a printing plate may fail to reproduce a distinct printed image. It is to be noted that the acid dissociation constant referred to herein is determined by the potentiometric method. In addition, it is preferred that the aliphatic nitrogen compound per se does not show photoconductivity since otherwise there would arise a problem of deteriorating an image pattern on the printing plate due to its photoconductivity when exposed to light during printing operation. Therefore, the aliphatic nitrogen compound for use in the printing plate of the present invention should preferably produce no photocurrent upon irradiation by light or produce only a small photocurrent at most $10^2$ times greater than the value of dark current measured without light irradiation. The values of photocurrents as herein referred to are measured by J. H. Sharp's Method, described in Journal of Physical Chemistry, 71, 2587 (1967). More particularly, a thin film of the nitrogen compound is formed on a strip of nesa glass and an electrode is placed on the nitrogen compound film to form a sandwich type cell. A grounded guard electrode is then placed on the thin film to surround the first-mentioned electrode. The electrode and nesa glass on opposite sides of the nitrogen compound film are connected to a battery and the current flowing across the thin film is measured without light irradiation to determine the dark current. Nextly, the photocurrent is measured by irradiating the thin film through the nesa glass by light projected from a 500W xenon lamp through a quartz lens and a water-filled quartz cell. The nitrogen content in the organic nitrogen compound is preferably in the range of 0.1 to 20 gram equivalent nitrogen atom/kg. If the nitrogen content is less than 0.1 gram equivalent/kg, the electroconductivity is reduced, resulting in a less favorable printing plate.

The aliphatic nitrogen compound employed herein may involve either one or more nitrogen atoms. A polymer prepared from a monomer involving aliphatic nitrogen atoms may also be employed. Particularly, such a polymer is convenient because it can be directly formed into a photosensitive material without compounding a suitable vehicle. In this case it is also desirable that the nitrogen content is in the range from 0.1 to 14 gram equivalent/kg on the basis of the polymer. On the other hand, if a low molecular weight compound which can not be formed a photosensitive material by itself is used as the nitrogen compound, a suitable vehicle must be added as a binder. It is also desirable that the nitrogen content is in the range from 0.1 to 14 gram equivalent/kg on the basis of the total amount of the nitrogen compound and the vehicle added. If the nitrogen content is less than 0.1 g. equiv./kg, the resultant plate is not practicable as the electrostatic printing plate as described above. If the content is above 14 g. equiv./kg, the resultant plate does not exhibit a problem with respect to photosensitivity, but its in physical properties are diminished.

The aliphatic nitrogen compound employed herein means to have one or more base units in which a nitrogen atom adjoins three carbon atoms each constituting an aliphatic hydrocarbon group, or two carbon atoms each constituting a aliphatic hydrocarbon group and a hydrogen atom. For example, the nitrogen compound has one or more base units represented by the formula:

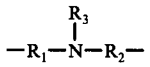

wherein $R_1$ and $R_2$ are independently a methylene or substituted or unsubstituted alkylidene group with 1 to 13 carbon atoms, and $R_3$ is hydrogen or a substituted or unsubstituted alkyl or aralkyl group with 1-13 carbon atoms. By way of example, the nitrogen compound may comprise a base unit represented by the above formula wherein $R_1$ and $R_2$ are independently a methylene, ethylidene or propylidene group, and $R_3$ is methyl, ethyl or isopropyl group. The above nitrogen compound may comprise a nitrogen cyclic structure, such as piperazine ring, as well as a chain structure. Since high volatility is not desirable, the nitrogen compound must have a boiling point of more than 100° C.

Examples of the aliphatic nitrogen compound employed herein are as follows: dibenzylamine, 3-methyl-3-dimethylaminomethyloxetane, 3-methyl-3-diethylaminomethyloxetane, 2-methyl-2-(N,N-dimethylaminomethyl)-1,3-propylenediacetate, 2-methyl-2-(N,N-dimethylaminomethyl)-1,3-propylenenedibenzoate, 2-bis(N,N-diethylaminomethyl)-1,3-propylenedibenzoate, piperidine N-methylpiperidine, piperazine, N-methylpiperazine, N,N'-dimethylpiperazine, N,N'-di-n-butylpiperazine, N-(4-aminocyclohexyl) piperazine, N,N'-bis(aminopropyl)piperazine, quinuclidine, N-methyldicyclohexylamine, N-methyl-di-n-butyl-amine, N-cyclohexyl-di-n-butylamine, tri-n-butylamine, N-isobutyl-di-n-butylamine, N,N-diethylaminomethylmethacrylate, N,N-dimethylaminomethylmethacrylate, N,N,N',N'-tetramethylethylenediamine, triethanolamine.

When the aliphatic nitrogen compound is a aliphatic nitrogen-containing polymer, any kind of polymer such as condensation polymers, addition polymers, ring-opened polymers and the like may be used, provided that a polymer has the above mentioned characteristics. Among these polymers are preferred polyesters, polyethers, vinyl polymers, polyamines, etc. Examples of the preferred aliphatic nitrogen-containing polyester include condensation polymers of aliphatic nitrogen-containing glycols such as 2-methyl-2-(N,N-dimethylamino)methyl-1,3-propanediol, 2-methyl-2-(N,N-diethylamino)methyl-1,3-propanediol, 2-methyl-2-piperidylmethyl-1,3-propanediol, 2,2-bis(N,N-dimethylaminomethyl)-1,3-propanediol, N,N-bis(2-hydroxyethyl)methylamine, N,N'-bis(2-hydroxyethyl)-2,5-dimethylpiperadine, etc. and dicarboxylic acids such as adipic acid, terephthalic acid, isophthalic acid, 1,4-dichlorohexane dicarboxylic acid, etc. Aliphatic nitrogen-containing polyethers may be obtained by polymerzing the above listed aliphatic nitrogen-containing glycols. Alternatively, the above glycol may be copolymerized with ethylene glycol, tetramethylene glycol, bis(4-hydroxyphenyl)methane, 2,2-bis(4-hydroxyphenyl)propane, bis(4-hydroxyphenyl)sulfone, hydroquinone, xylylene glycol, polyethylene glycol, etc. Examples of the preferred aliphatic nitrogen-containing vinyl polymers include polyaminoacrylates such as poly-2-(N,N-dimethylamino)ethylacrylate, poly-2-(N,N-dimethylamino)ethylmethacrylate, etc. and polystyrene direvatives such as poly-p-(N,N-dimethylaminomethyl) styrene, etc. In addition, polymers prepared from an ethyleneimine derivative, polymers from a diamine and a dihalogenated hydrocarbon and the like may also be useful. It is to be noted that the molecular weight of a polymer of more than 1,500 is sufficient for the above purpose. When a polymer is to be directly formed into a plate without a support, the polymer must have a molecular weight of more than 2,500.

As described above, either low or high molecular weight compounds may be used as the aliphatic nitrogen compound. Further the use of high molecular weight compounds is independent of the type of bond constituting a polymer. However, the aliphatic nitrogen compound should not be too hydrophilic. In a preferred embodiment according to the present invention the aliphatic nitrogen compound may have a moisture regain of 0.05 to 2.0% at a relative humidity of 65%, more particularly, less than 1.6%. If the moisture regain is above 2.0%, the resultant plate may fail to reproduce a copy with optimum density for lack of a sufficient charge at the unexposed portion.

When the aliphatic nitrogen compound by itself can not be directly formed into a plate, a suitable vehicle as a binder should be mixed therewith. Useful vehicles are, for example, polyvinylbutyral, polyvinylformal, polystyrene, ABS resin, methylmethacrylate resin, ethylene-vinylacetate copolymers, polycarbonates, polyesters, etc. Preferably the binder may also have a moisture regain of 0.01 to 2.0wt% at a relative humidity of 65% as understood from the above. The binder is blended so that the nitrogen content is in the range from 0.1 to 14 gram equivalent/kg on the basis of the total amount of the nitrogen compound and the vehicle added.

The photosensitive composition employed herein contains an organic halogen compound too. Since the organic halogen compound must be able to generate a free radical upon the irradiation of light, it is desirable for the bond energy between halogen and an atom bonded thereto to be 46 to 80 kcal/gram-bond. If the bond energy is less than 46 kcal/gram-bond, the resultant photosensitive composition is less stable. On the contrary, if the bond energy is above 80 kcal/gram-bond, the resultant photosensitive composition is less photosensitive. The preferred organic halogen compounds employed herein are compounds having the formula:

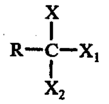

wherein X is halogen, $X_1$ and $X_2$ are independently halogen and hydrogen, and R is

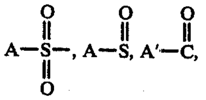

halogen, hydrogen, substituted or unsubstituted alkyl and aryl wherein A is substituted or unsubstituted alkyl, aryl and heterocyclic compound residue and A' is hydrogen, substituted or unsubstituted alkyl, aryl and heterocyclic compound residue; and compounds having the formula:

R' — S — X' wherein X' is halogen and R' is substituted or unsubstituted alkyl and aryl. Among these are most preferred compounds having the formula:

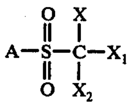

wherein X is halogen, $X_1$ and $X_2$ are independently halogen and hydrogen, and A is substituted or unsubstituted alkyl, aryl and heterocyclic compound residue, and compounds having the formula:

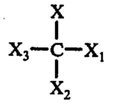

wherein X is halogen, and $X_1$, $X_2$ and $X_3$ are independently halogen and hydrogen.

Examples of the preferred halogen compounds having the above formulas include:

bis(tribromomethyl)sulfone, trichloromethyl-phenylsulfone, tribromomethyl-phenylsulfone, trichloromethyl-p-chlorophenylsulfone, tribromomethyl-p-nitrophenylsulfone, 2-trichloromethylbenzothiazolesulfone, 4,6-dimethylpyridine-2-tribromomethylsulfone, 2,4-dichlorophenyl-trichloromethylsulfone, bis(tribromomethyl)sulfoxide, dibromomethyl-tribromomethylsulfoxide, tribromomethylphenylsulfoxide, tribromoacetophenone, trichloroacetophenone, o-nitro-tribromoacetophenone, m-nitro-tribromoacetophenone, p-nitro-tribromoacetophenone, m-bromotribromoacetophenone, 3,4-dichloro-tribromoacetophenone, p-bromotribromoacetophenone, 1,4-bis(tribromoacetyl)benzene, carbon tetrabromide, iodoform, carbon tetrachloride, carbon tetraiodide, pentabromoethane, 2,2,2-tribromoethanol, bromotrichloromethane, trichlorofluoromethane, hexachloroethane, hexabromoethane, trichlorotrifuoroethane, 2,4-dinitrobenzenesulfenylchloride, o-nitrobenzenesulfenylchloride, etc. The organic halogen compound may be present in an amount of 0.01 to 2.0 moles per mole of nitrogen atom of the aliphatic nitrogen compound, preferably 0.05 to 1.0 mole.

There is thus disclosed photosensitive composition containing the above two components, the aliphatic nitrogen compound and organic halogen compound, which is highly sensitive. From the standpoint of use as an electrostatic printing plate, however, it is desired to further increase the sensitivity. To this end any desired sensitizer or spectrosensitizer may be added.

Since the photosensitive composition according to the present invention gives rise to a particular photoreaction, a sensitizer to be added should be carefully selected. Benzyl, anthraquinone, benzophenone, benzoin and isoalloxazine series sensitizers are especially useful. Examples of the preferred sensitizer include benzyl, anthraquinone, β-methylanthraquinone, β-chloroanthraquinone, 2,3-dichloroanthraquinone, 1,2-benzanthraquinone, 2,3-benzanthraquinone, 1,4-dimethylanthraquinone, 2,3-dimethylanthraquinone, β-phenylanthraquinone, 2,3-dihenylanthraquinone, 3-chloro-1,2-benzanthraquinone, 1,5-dinitroanthraquinone, benzophenone, 4,4′-dimethoxybenzophenone, 3,4-dichlorobenzophenone, benzoin, benzoinmethylether, benzoinethylether, α-methylbenzoin, α-phenylbenzoin, α-allylbenzoin, isoalloxazine, vitamin $B_2$, vitamin $B_2$ phosphate, isoriboflavin, dichlororiboflavin, etc. One or more of the above sensitizers may be added. On blending the sensitizer may be incorporated in an amount of 0.03 to 30 parts by weight per hundred parts of the aliphatic nitrogen compound. When the sensitizer is incorporated into a photosensitive composition, the exposure time required to obtain a picture with the same contrast is reduced to a fraction or several tenths of that required for a photosensitive composition blended without a sensitizer. In other words, the substantial photosensitivity is increased by several or several tens times.

Into the photosensitive composition according to this invention a spectrosenzitizer selected from xanthen, acridine, thiazine and cyanin series dyestuffs may be incorporated to remarkably improve the photosensitivity at the visible light region. Examples of the preferred spectrosensitizer include xanthenes such as uranine, Fluoresceine, Rose Bengale, Erythrosin B, Eoxine B, Eosine Y, Rhodamine B, Phloxine B, etc.; acridines such as Acridine Orange, Acridine Yellow Trypaflavin, etc.; thiazines such as Thionine Blue, Methylene blue, etc.; cyanins such as pinacyanol, etc. On addition the spectrosensitizer may be incorporated in an amount of 0.00001 to 10 parts by weight per hundred parts of the aliphatic nitrogen compound.

When the aliphatic nitrogen compound is a nitrogen-containing polyester or polyether, the addition of a polyvalent isocyanate may be useful in that the difference in charged potential between the exposed and the unexposed portions becomes larger and the photosensitivity of the composition is further improved. The addition of the polyvalent isocyanate also serves to prevent the composition from deteriorating by discharge during the electrostatic printing. In general, a corona discharge is repeated several hundreds or thousands of times during the ordinary electrostatic printing. It is inevitable that aliphatic compounds are eventually deteriorated by discharge. This is also true for the photosensitive composition according to this invention. When the photosensitive composition is formed into a thin film of several 10 μ in thickness and the film is subjected to a continuous corona discharge at 10 kV with a space of 1.3 cm for 10 minutes, some of the compositions will result in 10% reduction of their charged potential. However, compositions which contain the same components as above and a polyvalent isocyanate in addition have seen found that their charged potential is not reduced at all even after the continuous corona discharge for 30 minutes. As apparent from the above the addition of a polyvalent isocyanate substantially serves the dual effects. Examples of the preferred polyvalent isocyanate include bivalent isocyanates such as diphenylmethane-4,4′-diisocyanate, biphenyl-4,4′-diisocyanate, toluene-2,4-diisocyanate, m-phenylenediisocyanate, p-phenylenediisocyanate, 1,5-naphthylenediisocyanate, 1,4-tetramethylenediisocyanate, xylylenediisocyanate, dichlorohexylmethane-4,4′-diisocyanate, 1,5-tetrahydronaphthylenediisocyanate, etc.; trivalent isocyanates such as 1-methylbenzene-2,4,6-triisocyanate, triphenylmethane-4,4′,4″-triisocyanate, diphenylmethane-2,4,4′-triisocyanate, etc., and the like. On addition the polyvalent isocyanate may preferably be incorporated in an amount of 0.1 to 15 parts by weight per hundred parts of the nitrogen-containing polymer.

A photosensitive material, which is eventually prepared into the electrostatic printing master plate according to this invention, may be manufactured by forming the above-mentioned photosensitive composition in the form of sheet or by coating a substrate or support with the composition. In the former case, that is, when the photosensitive composition by itself is used in the form of sheet, such a sheet is ready for use. It is also desirable to vapor deposit a metal to form an electroconductive film, to build up carbon black or graphite uniformly, or to apply an electroconductive resin on the rear surface of the sheet. The electroconductive resins which may be applied on the sheet are cationic polymers involving a quaternary ammonium salt in a unit thereof, anionic polymers involving a sulfonate or phosphonate in a unit thereof, and nonionic polymers such as polyalcohols, polyethers, etc. By way of example, polymers available under the trade marks of Conductive Polymer 261 (manufactured and sold by Calgon Co.), Dow ECR - 34 (Dow Chemical), Oligo Z (Tomoegawa Paper Mfg., Co.), etc. may be used. The resin may be applied alone or in combination with clay, starch and the like, preferably to a thickness of 1 to 20 μ. In the latter case, that is, when the material is manufactured by coating a substrate or support with the photosensitive composition, a photosensitive coating layer may be applied on a sheet of metal such as aluminum, iron, zinc, copper, etc., paper, cloth, non-woven cloth, or any other suitable film. In case of a substrate other than the metal sheet, it is preferred to dispose an undercoat between the substrate and the photosensitive layer or to apply an auxiliary coating on the rear surface or the upper and rear surfaces of the substrate, both the undercoat and the auxiliary coating being made of carbon black, graphite, metal or electroconductive resin so as to be electroconductive, as described in the former case. The electroconductive undercoat or auxiliary coating may preferably be applied to a thickness of 1 to 20 $\mu$. Alternatively, such an auxiliary coating may be established by impregnating the substrate with the above-described material. The electroconductive resin may, of course, be blended with clay, starch and the like, as described in the former case. Instead of coating the substrate with the above-described electroconductive agent, if the substrate is paper, the electroconductive agent may be mixed with raw paper before it is made into a sheet.

According to this invention an electrostatic printing plate is manufactured by subjecting the photosensitive material to the irradiation of image light to form an electroconductive pattern. To this end a conventional discharge lamp, for example, a high pressure mercury-arc lamp, super-high pressure mercury-arc lamp, xenon lamp, carbon arc lamp, electroflash lamp and the like may be used as a light source for exposure. An image-bearing original or document may be selected from a conventional silver halide photograph original (positive), an original constituted on a transparent film or paper sheet, a conventional printed matter (document, book, etc.) and the like.

According to the present invention the image on the original or document is reproduced by projection on the surface of the photosensitive material as an electroconductive pattern which must correspond to the image projected as exactly as possible, the pattern-bearing material being ready for use as an electrostatic printing plate. The projection of the image or the exposure of the material may be carried out in any desired manner. In a first method the light transmitted through an original is projected on a photosensitive material. In this arrangement the original is disposed between the photosensitive material and a light source. If the original adjoins the material, these two should be in as close as possible contact with each other to produce the highest possible resolution. If the original is spaced from the material, it may be preferred to dispose an optical system such as a lens between these two. In a second method the light reflected by an original is used. This method is particularly suitable when the original is a printed matter both sides of which are printed, for example, in the case of a book. Of course, the original is not in contact with a photosensitive material. The light emitted from a light source is projected on the surface of the original and reflected thereby. The reflected light is directed toward the material to form a pattern corresponding to the image of the original. To assist in forming the pattern an optical system consisting of a lens and/or mirror may preferably be disposed between the original and the material. The light may act on the original in two ways. In one way the whole surface of the original is exposed to light. In the other way, the original is scanned by the light source or vice versa so that only a limited part of the original is exposed to light in sequence. In this second method a visible light source may preferably used. A third method is called the transmission-reflection. An original is in close contact with a photosensitive material in a face-to-face relation. The light emitted by a light source is projected on the material at the rear surface thereof wholly. The light transmitted by the material is partly absorbed by an image-bearing or black portion. The transmitted light is partly reflected by a plate or white portion and then the reflected light is again reflected by a substrate of the material. Since the reflection is repeated many times, there will be a great difference in light quantity between the black and the white portions. The method which makes use of the above principle is specifically applicable when the original is a printed matter both sides of which are printed. However, it is not suitable to use an entirely opaque metal sheet or an entirely transparent film as the substrate of the photosensitive material. A semi-transparent substrate, for example, paper is favorable. In the third method a visible light source is generally used.

Surprisingly the inventors have found that when the photosensitive material after the exposure to the light image is heated in suitable conditions the volume resistivity at only the exposed portion is considerably reduced. This substantial reduction in volume resistivity ensures to shorten the exposure time required to obtain an effective photoconductive pattern to 1/10 to 1/1,000. The application of heat may be carried out concurrently with the exposure, but generally after the exposure. Heating conditions necessary to accomplish the optimum amplification of the pattern depend on the photosensitive composition employed. In usual the heating temperature is 40° to 200° C, preferably 120° to 180° C and the heating period is 1 second to 10 minutes, preferably 1 to 3 minutes. The exposed material may be heated in any suitable manner by irradiating with infrared or far infrared rays, blowing of hot air, passing through hot rolls or electrically heating with a nichrom wire. Such a process of amplification by heating is of dry type so that a heating means may be easily incorporated in an electrostatic printing machine.

There is thus disclosed the electrostatic printing plate according to the present invention. The use of the plate and printing process of the present invention is far more expedient as compared with the conventional well-known printing systems, First the plate is submitted to a corona discharge to charge the surface thereof. The resulting electrostatic latent pattern corresponds to the pattern with varying electroconductivity on the plate. Then toner is applied on the surface of the plate to develope the latent pattern. The toner is selectively attracted to the highly charged (unexposed) portion. A printing medium of a suitable form such as paper, woven or nonwoven cloth, film or the like is contacted with the toner-bearing surface of the plate, whereupon charge is applied by a further corona discharge from the rear side of the printing medium or alternatively by contacting same with an inversely charged conductive roller, causing the toner to be transferred onto the printing medium. The transfer of the toner image is followed by heating by a suitable heating means to fix the transferred image pattern on the printing medium.

The once used printing plate is again subjected to discharge with or without cleaning of the toner which remains on the plate with use of a brush, cloth, cotton or the like. Thus, a plural number of the same prints can be obtained by repeating the cycle of operations of discharge, toner development, toner image transfer and, if necessary, cleaning. The foregoing description referred to a printing plate of a flat plate-like form. However, from the standpoint of increasing the printing speed, it is more preferable to mount the printing plate around a rotatable drum to cooperate with discharging, developing, transferring and cleaning mechanisms which are stationed around the circumference of the drum.

Useful developing methods include the cascade, magnetic-brush, and powder-craft methods using a powdery toner. If desired, a polar liquid developing ink may be used to produce special print effects. Alternatively, instead of transferring the toner from the plate to the printing medium, the printing plate with an electrostatic latent image may be contacted with the printing medium to transfer the electrostatic image pattern itself (electrostatic image transfer method). It is also possible to effect the corona discharge on a printing medium which is held in contact with the printing or image to be reproduced to form an electrostatic latent image pattern directly on the printing medium, developing the latent image by a toner and fixing same in a similar manner to obtain a print thereon.

In the drawing, the single FIGURE is a diagrammatic illustration of an electrostatic printing machine in which a printing plate according to the present invention is employed.

The printing machine comprises a drum 1 on which a printing plate is wound, a corona discharge head 2 for charging the plate on the drum 1, a magnet means 3 for supplying toner to develope a pattern on the plate, a corona discharge head 4 for transferring the toner on the plate to a paper sheet, and a heater 5 for fixing the transferred toner on the sheet. The paper to be printed from a roll 8 is supplied through carrying rollers 7 to a transfer region and then wound up by another roll 9. 6 is a rolling brush for removing the residual toner.

As a comparative example a photosensitive selenium plate was exposed to form a master plate. With the use of Xerox 1385 (manufactured by Rank Xerox Co.) an electrostatic toner transfer process was repeated to make copies. Though sufficient toner was supplemented, the image density was lowered in the fifth copy reproduced from the same plate. Thereafter only vague copies were obtained, because the electrostatic charge pattern on the photoconductor had been lost. The same electrostatic toner transfer process with the use of Xerox 1385 was repeated except that the printing plate according to the invention was used. In this case more than 100 clear copies with the same image density were reproduced, provided that the toner was supplemented. After two months the same plate was used again to reproduce clear copies equivalent to the initial copies. This result is truely based on the fact that the electroconductive pattern offered by the photosensitive composition according to the invention is parmanent.

Other objects and further scope of applicability of the present invention will become apparent from the detailed description given hereinafter; it should be understood however, that the detailed description and specific examples, while indicating preferred embodiments of the invention, are given by way of illustration only, since various changes and modifications within the spirit and scope of the invention will become apparent to those skilled in the art from this detailed description.

The invention will now be described in further details with reference to the following, non-limiting, examples.

EXAMPLE 1

In 5.8 parts of methyl etnyl ketone were dissolved 0.85 part of carbon tetrabromide, 0.05 part of benzyl and 1.0 part of a polyester prepared from N,N-bis(2-hydroxy-n-propyl)ethylamine and terephthalic acid and having a repeating unit represented by the formula:

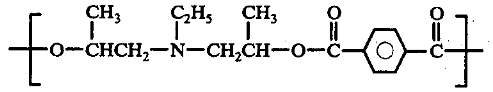

The resultant solution was cast on a Teflon-coated dish placed on a horizontal base and the solvent was then stripped off, obtaining a film of 60μ in thickness. Another film was also prepared in the same manner. One film (*a*) was exposed to light for 60 seconds by means of a 500W super-high pressure mercury lamp spaced apart by 17 cm from the film. Both the exposed film *a* and the film *b* (not exposed) were placed in a desiccator at a relative humidity of 75% for 5 days to adjust the moisture content of the films. Then the volume resistivity of the films was determined by means of the Takeda-Riken TR 84-C Vibrational Read Electrometer. The results are as follows.

| film | volume electric resistivity (Ωcm) |
|---|---|
| a | $4.8 \times 10^{11}$ |
| b | $9.0 \times 10^{13}$ |

EXAMPLE 2

In 5.8 parts of benzene were dissolved 0.6 part of trichloromethylphenylsulfone and 1.0 part of a polyester prepared from N,N'-bis(2-hydroxypropyl-2,5-dimethylpiperadine and terephthalic acid and having a repeating unit represented by the formula:

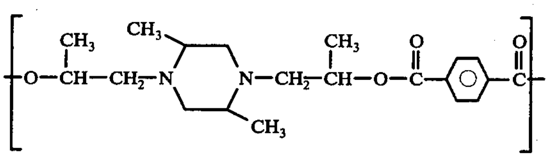

The resultant solution was applied to an aluminum plate of 200μ in thickness by means of a bar-coater and the solvent was then stripped off, obtaining a photosensitive material with a photosensitive layer of 15μ in thickness. On the surface of the material was placed an original positive film. Then the photosensitive material was exposed to the ultraviolet light trasmitted by the original by means of a 200 W fluorescent lamp (20 W × 10) spaced apart by 4.5 cm from the material, obtaining an electrostatic printing plate. Then the plate was set on a toner-developing and transferring device in Xerox 1385 (manufactured by Rank Xerox), in which a corona discharge and toner development by a cascade method were carried out. There was obtained a clear toner image on the plate. The portion of the plate which corresponds to the white portion of the original attracted no toner. The blank was found to be an excellent printing plate without contamination.

EXAMPLE 3

In 5.8 parts of benzene was dissolved 1.0 part of a polyester prepared from 2-methyl-2-(N,N-dimethylamino)methyl-1,3-propanediol and terephthalic acid. To this mixture was added 0.05 part of diphenylmethane-4,4'-diisocyanate at 20° C, with stirring for 20 minutes. Then 0.034 part of β-methylanthraquinone and 0.18 part of tribromomethyl phenylsulfone were added to the mixture, with further stirring for 10 minutes, obtaining a photosensitive solution.

An electroconductive agent prepared by dispersing 25 parts of Dow ECR 34 (manufactured by Dow Chemical Co.), 25 parts of soluble starch and 100 parts of clay in 300 parts of water was applied to a weight of 3 g/m² on a single surface of a precoated paper of about 200μ in thickness by means of a bar-coater. After drying there was obtained an electroconductive paper.

The photosensitive solution was applied on the electroconductive paper by means of a bar-coater in the dark and the solvent was then stripped off, obtaining a photosensitive material with a photosensitive layer of 15μ in thickness. On the surface of the photosensitive material was placed a positive original. As described in Example 2, the photosensitive material was exposed for 1 second to obtain an electrostatic printing plate. The thus obtained plate was set on a drum of an electrostatic printing machine shown in the FIGURE, in which a printing process of corona discharge, toner development and transfer was performed at a rate of 30 sheets per minute. Even after 500 sheets of paper were printed, the image density was still maintained constant.

EXAMPLE 4

In 5.8 parts of xylene was dissolved 1.0 part of a polyether prepared from 2-methyl-2-(N,N-diethylaminomethyl)-1,3-propanediol and bisphenyl A and having a repeating unit represented by the formula:

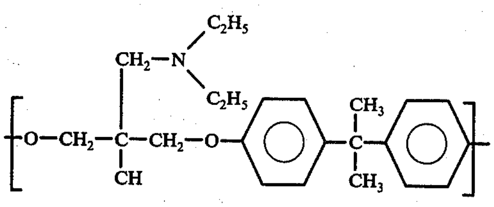

To this mixture was added 0.05 part of 4,4'-diphenylmethanediisocyanate, with stirring at 20° C for 20 minutes. To the resultant solution was added 0.10 part of hexabromodimethylsulfone and then added dropwise 0.5 part of a solution of 0.8 part of Rose Bongale in 10 parts of DMF with vigorous stirring. Further stirring of the solution at 20° C for 10 minutes resulted in a photosensitive solution.

The photosensitive solution was applied on an aluminum plate of 200μ in thickness by means of a bar-coater in the dark and the solvent was then stripped off, obtaining a photosensitive material with a photosensitive layer of about 20μ in thickness. This member was set on an exposure device of Xerox 1385 and exposed for 5 minutes to the light reflected by an original to obtain a printing plate.

With use of the electrostatic printing plate a printing process was carried out at a rate of 40 sheets per minute, as described in Example 3. Even after 400 sheets of paper were printed, the image density was still maintained constant.

EXAMPLE 5

In 5.8 parts of THF were dissolved 0.5 part of a commercial polyester resin, Vylon 300 (manufactured by Toyo Boseki Co.) and 0.2 part of α,α,α-p-tetrabromoacetophenone and 0.5 part of a polyether prepared by the self condensation of 2-methyl-2-(N,N-dimethylaminomethyl)-1,3-propanediol and having a repeating unit represented by the formula:

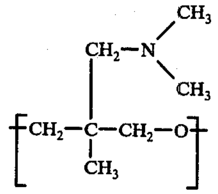

To the THF solution was added dropwise 0.5 part of a solution of 0.42 part of 2-aminoanthraquinone in 10 parts of DMF with vigorous stirring.

The resultant photosensitive solution was applied to a layer thickness of about 20μ on a paper of about 50μ in thickness by means of a bar-coater in the dark, obtaining a photosensitive material. This material was made contact with an original (written with black ink on an ordinary paper), the surface to be reproduced of the original being adjacent to the photosensitive layer of the material. The photosensitive material was exposed for 60 seconds at its rear side by means of a tungsten lamp (30 W × 16), obtaining a printing plate.

With use of the electrostatic printing plate a printing process was carried out at a rate of 40 sheets per minute, as described in Example 3, to print 400 sheets of paper.

EXAMPLE 6

In 5.8 parts of toluene were dissolved 0.3 part of carbon tetrabromide, 0.06 part of β-methylanthraquinone and 1.0 part of a copolymer of 40/60 N,N-diethylaminoethyl-methacrylate and ethylene. The resultant photosensitive solution was applied on an electroconductive paper prepared in Example 3 by means of a bar-coater and the solvent was then stripped off, obtaining a photosensitive material with a photosensitive layer of about 15μ in thickness.

On the surface of this material was placed the original which was a tracing paper written with black ink. The nmaterial was exposed to light for 40 seconds by means of a 200 W fluorescent lamp spaced apart by 4.5 cm to obtain a printing plate.

The resultant electrostatic printing plate was set on a drum of a printing machine as described in Example 3. In this example 200 sheets of paper were printed at a rate of 20 sheets per minute.

EXAMPLE 7

A photosensitive solution described in Example 1 was prepared except that 0.03 part of β-methylanthraquinone was substituted for 0.05 part of benzyl. The solution was applied to a layer thickness of about 15μ on an aluminum plate (200μ in thickness) by means of a bar-coater. This plate was divided into two materials *a* and *b*. On the surface of the materials *a* and *b* were placed positive film originals respectively. The materials *a* and *b* were exposed to light for 1 and 1/100 second, respectively (in each case a shutter was used so that an exposed area was small). The material *b* was heated at 160° C for 2 minutes in a hot-air dryer and then adjusted of its moisture content for 24 hours at a relative humidity of 70%, while the material *a* was treated no more. The materials *a* and *b* were developed with toner, as described in Example 2. It was found that both the materials *a* and *b* carried clear toner images, blacknesses of which were substantially equal to each other. This example reveals the amplification effect by heating.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An electrostatic printing plate having a permanent electroconductive pattern on the exposed surface thereof, said pattern being formed by irradiation of light so as to expose a light image on a photosensitive material comprising a photosensitive composition containing an aliphatic nitrogen compound and a halogen compound capable of generating a free radical upon irradiation by light, said aliphatic nitrogen compound has one or more base units represented by the formula:

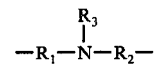

wherein $R_1$ and $R_2$ are independently a methylene and a substituted or unsubstituted alkylidene group with 1-13 carbon atoms, and $R_3$ is selected from at least one member of the group consisting of hydrogen, and substituted or unsubstituted alkyl or aralkyl group with 1-13 carbon atoms.

2. The electrostatic printing plate as claimed in claim 1 wherein the unexposed portion of the photosensitive material has a volume electric resistivity of more than $10^{12}\Omega cm$ and the ratio of volume electric resistivities of said unexposed to said exposed portion or the electroconductive pattern-carrying portion is not less than 2/1.

3. The electrostatic printing plate as claimed in claim 2 wherein said photosensitive material has a moisture regain of 0.05 to 2.0 wt% at a relative humidity of 65%.

4. The electrostatic printing plate as claimed in claim 2 wherein said aliphatic nitrogen compound has an acid dissociation constant within the range from 7.50 to 11.40.

5. The electrostatic printing plate as claimed in claim 4, wherein said aliphatic nitrogen compound produces a photocurrent 1 to $10^2$ times greater than a dark current as produced under non-irradiating conditions.

6. The electrostatic printing plate as claimed in claim 5 wherein said aliphatic nitrogen compound has a nitrogen content of 0.1 to 20 gram equivalent/kg.

7. The electrostatic printing plate as claimed in claim 6 wherein the nitrogen atom in said aliphatic nitrogen compound adjoins carbon and/or hydrogen and at least two additional adjacent carbon atoms each of said carbon atoms constituting an aliphatic hydrocarbon group.

8. The electrostatic printing plate as claimed in claim 3 wherein said aliphatic nitrogen compound of said photosensitive material has a moisture regain of 0.05 to 2.0 wt% at a relative humidity of 65%.

9. The electrostatic printing plate as claimed in claim 6 wherein said aliphatic nitrogen compound is a polymer having a molecular weight of more than 1,500 and a nitrogen content of 0.1 - 14 gram equivalent/kg.

10. The electrostatic printing plate as claimed in claim 2 wherein said organic halogen compound has a bond energy between halogen and an atom bonded thereto of 46 to 80 kcal/grambond.

11. The electrostatic printing plate as claimed in claim 10 wherein said organic halogen compound is represented by the formula:

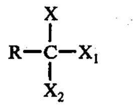

wherein X is halogen, $X_1$ and $X_2$ are halogen or hydrogen, and R is selected from at least one member of the group consisting of

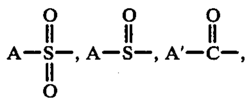

halogen, hydrogen, substituted or unsubstituted alkyl and aryl wherein A is substituted or unsubstituted alkyl, aryl and heterocyclic compound residue, and A' is hydrogen, substituted or unsubstituted alkyl, aryl and heterocyclic compound residue.

12. The electrostatic printing plate as claimed in claim 1, wherein said organic halogen compound capable of generating a free radical upon irradiation of light is blended at a rate of 0.01 to 2.0 moles per mole of nitrogen atom of said aliphatic nitrogen compound.

13. The electrostatic printing plate as claimed in claim 1 wherein said photosensitive material comprises a substrate selected from at least one member of the group consisting of a metal sheet, paper, cloth, nonwoven cloth and film and a coating layer of the photosensitive composition containing the aliphatic nitrogen compound and the organic halogen compound on said substrate.

14. The electrostatic printing plate as claimed in claim 13 wherein an electroconductive layer is disposed between the substrate and the coating layer.

15. The electrostatic printing plate as claimed in claim 1 wherein said photosensitive composition further contains a sensitizer selected from at least one member of the group consisting of benzyl, anthraquinone, benzophenone, benzoin and isoalloxazine series sensitizers.

16. The electrostatic printing plate as claimed in claim 1 wherein said photosensitive composition further contains at least one member of the group consisting of xanthene, acridine, thiazine and cyanin series dyestuffs.

17. The electrostatic printing plate as claimed in claim 9 wherein said aliphatic nitrogen compound is a polyester prepared from a nitrogen-containing glycol and a dicarboxylic acid.

18. The electrostatic printing plate as claimed in claim 9 wherein a polyvalent isocyanate is blended in the photosensitive composition.

19. The electrostatic printing plate as claimed in claim 17 wherein said aliphatic nitrogen compound is a polyester prepared from 2-methyl-2-(N,N-dimethylaminomethyl)-1,3-propanediol and terephthalic acid.

20. The electrostatic printing plate as claimed in claim 9 wherein said aliphatic nitrogen compound is a polyether prepared from 2-methyl-2-(N,N-diethylaminomethyl)-1,3-propanediol and 2,2-bis(4'-hydroxyphenyl)propane.

21. The electrostatic printing plate as claimed in claim 11 wherein said organic halogen compound is represented by the formula:

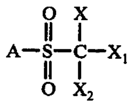

wherein X is halogen, $X_1$ and $X_2$ are independently halogen and hydrogen and A is substituted or unsubstituted alkyl, aryl and heterocyclic compound residue.

22. The electrostatic printing plate as claimed in claim 21 wherein said organic halogen compound is bis(tribromomethyl) sulfone.

23. The electrostatic printing plate as claimed in claim 21 wherein said organic halogen compound is tribomomethyl phenyl sulfone.

24. The electrostatic printing plate as claimed in claim 11 wherein said organic halogen compound is carbon tetrabromide.

25. A method of using the electrostatic printing plate as claimed in claim 1 for printing, which comprises
(a) charging the plate to form a charge pattern thereon,
(b) applying toner to the surface of the plate to develop the pattern, and
(c) transferring the toner on the plate to a member to be printed.

26. A method of using the electrostatic printing plate as claimed in claim 1 for printing, which comprises
(a) charging the plate to form a charge pattern thereon,
(b) transferring the charge pattern on the plate to a member to be printed, and
(c) applying toner to the surface of the member to develop the pattern.

27. An electrostatic printing plate comprising a photosensitive material having a permanent electroconductive pattern exposed in the surface thereof, said material comprising a photosensitive composition containing an aliphatic nitrogen compound and a halogen compound capable of generating a free radical upon irradiation by light.

28. A method of preparing an electrostatic printing plate which comprises providing a photosensitive material comprising a photosensitive composition containing an aliphatic nitrogen compound and a halogen compound capable of generating a free radical upon irradiation by light, and exposing said photosensitive material to a light image so as to produce a permanent electroconductive pattern therein.

29. The method as disclosed in claim 28 further including the step of heating said photosensitive material after the exposure to the light image.

30. The electrostatic printing plate prepared according to the process of claim 29.

31. The method as disclosed in claim 28 wherein the unexposed portion of the photosensitive material has a volume electric resistivity of more than $10^{12}$ Ωcm and the ratio of volume electric resistivity of said unexposed to said exposed portion or the electroconductive pattern-carrying portion is not less than 2/1.

32. The method as disclosed in claim 31 wherein said photosensitive material is exposed to said image by way of light transmitted through an original.

33. The method as disclosed in claim 29 wherein said photosensitive material is exposed to said image by way of light reflected by a document.

34. The electrostatic printing plate prepared according to the process of claim 33.

35. An electrostatic printing process which comprises:
(a) Providing an electrostatic printing plate as disclosed in claim 27;
(b) Charging the surface of said plate having the electroconductive pattern exposed therein to form a charge pattern;
(c) Applying toner to said plate so as to develop said pattern;
(d) Transferring said toner to a member to be printed; and
(e) Repeating steps (b) through (d) at least once.

36. An electrostatic printing process which comprises:
(a) Providing an electrostatic printing plate as disclosed in claim 27;
(b) Charging the surface of said plate having the electroconductive pattern exposed therein to form a charge pattern;
(c) Transferring said charge pattern on the plate to a member to be printed;
(d) Applying toner to the surface of the member to develop said pattern; and
(e) Repeating steps (b) through (d) at least one time.

* * * * *

UNITED STATES PATENT AND TRADEMARK OFFICE

CERTIFICATE OF CORRECTION

PATENT NO. : 4,111,692

DATED : Sept. 5, 1978

INVENTOR(S) : K. Etoh et al

It is certified that error appears in the above-identified patent and that said Letters Patent are hereby corrected as shown below:

Under the heading "[75] Inventors" change the name of the fourth inventor from "Watanabe Kazuo" to --Kazuo Watanabe--

Signed and Sealed this

*Twenty-fourth* Day of *February 1981*

[SEAL]

*Attest:*

RENE D. TEGTMEYER

*Attesting Officer* *Acting Commissioner of Patents and Trademarks*